US010805562B2

(12) United States Patent
Nakamura et al.

(10) Patent No.: US 10,805,562 B2
(45) Date of Patent: Oct. 13, 2020

(54) IMAGING DEVICE, MANUFACTURING METHOD, SEMICONDUCTOR DEVICE, AND ELECTRONIC DEVICE

(71) Applicant: SONY SEMICONDUCTOR SOLUTIONS CORPORATION, Kanagawa (JP)

(72) Inventors: Ryosuke Nakamura, Kanagawa (JP); Fumihiko Koga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 270 days.

(21) Appl. No.: 15/742,248

(22) PCT Filed: Jul. 1, 2016

(86) PCT No.: PCT/JP2016/069595
§ 371 (c)(1),
(2) Date: Jan. 5, 2018

(87) PCT Pub. No.: WO2017/014025
PCT Pub. Date: Jan. 26, 2017

(65) Prior Publication Data
US 2018/0197902 A1    Jul. 12, 2018

(30) Foreign Application Priority Data
Jul. 17, 2015    (JP) .................................. 2015-143164

(51) Int. Cl.
H01L 27/146    (2006.01)
H04N 9/04    (2006.01)
(Continued)

(52) U.S. Cl.
CPC ........... *H04N 5/374* (2013.01); *H01L 27/146* (2013.01); *H04N 5/369* (2013.01); *H04N 5/3696* (2013.01);
(Continued)

(58) Field of Classification Search
CPC .. H01L 27/146; H04N 9/04563; H04N 5/369; H04N 5/3696; H04N 5/374
See application file for complete search history.

(56) References Cited

U.S. PATENT DOCUMENTS 8,773,562 B1 * 7/2014 Fan .................. H01L 27/14641
348/308
2008/0079806 A1    4/2008 Inuiya et al.

FOREIGN PATENT DOCUMENTS

JP    2006-086241 A    3/2006
JP    2006086241 A  *  3/2006
(Continued)

OTHER PUBLICATIONS

International Search Report and Written Opinion of PCT Application No. PCT/JP2016/069595, dated Sep. 20, 2016, 08 pages of ISRWO.

*Primary Examiner* — Zandra V Smith
*Assistant Examiner* — Abbigale A Boyle
(74) *Attorney, Agent, or Firm* — Chip Law Group

(57) ABSTRACT

The present disclosure relates to an imaging device, a manufacturing method, a semiconductor device, and an electronic device that can further improve image quality. An imaging device includes a photoelectric conversion unit that receives and photoelectrically converts light, a floating diffusion layer that accumulates charge generated by the photoelectric conversion unit, and a diffusion layer that serves as a source or a drain of a transistor. Then, the floating diffusion layer is formed to have an impurity concentration lower than an impurity concentration of the diffusion layer.

(Continued)

In addition, both a first photoelectric conversion unit that is able to accumulate the charge generated by the photoelectric conversion and a second photoelectric conversion unit from which the charge generated by the photoelectric conversion is sequentially taken out and accumulated in the floating diffusion layer are provided as the photoelectric conversion unit in one pixel, and the first photoelectric conversion unit and the second photoelectric conversion unit are arranged in a line in a longitudinal direction along a direction of illumination of light. The present technology can be applied to, for example, a back-illuminated CMOS image sensor.

10 Claims, 15 Drawing Sheets

(51) Int. Cl.
   *H04N 5/374* (2011.01)
   *H04N 5/369* (2011.01)
(52) U.S. Cl.
   CPC ..... *H04N 9/04563* (2018.08); *G06T 2207/10* (2013.01); *G09G 2310/0264* (2013.01); *G09G 2320/02* (2013.01)

(56) References Cited

FOREIGN PATENT DOCUMENTS

| | | |
|---|---|---|
| JP | 2006-108466 A | 4/2006 |
| JP | 2008-085159 A | 4/2008 |

\* cited by examiner

IMAGING DEVICE, MANUFACTURING METHOD, SEMICONDUCTOR DEVICE, AND ELECTRONIC DEVICE

CROSS REFERENCE TO RELATED APPLICATIONS

This application is a U.S. National Phase of International Patent Application No. PCT/JP2016/069595 filed on Jul. 1, 2016, which claims priority benefit of Japanese Patent Application No. JP 2015-143164 filed in the Japan Patent Office on Jul. 17, 2015. Each of the above-referenced applications is hereby incorporated herein by reference in its entirety.

TECHNICAL FIELD

The present disclosure relates to an imaging device, a manufacturing method, a semiconductor device, and an electronic device, and particularly, to an imaging device, a manufacturing method, a semiconductor device, and an electronic device that can further improve image quality.

BACKGROUND ART

Conventionally, there is a CMOS solid state imaging device (hereinafter, referred to as CMOS image sensor) known as a solid-state imaging device that can be manufactured by a process similar to the process for a CMOS (Complementary Metal Oxide Semiconductor) integrated circuit.

In the CMOS image sensor, a miniaturization technique associated with a CMOS process can be used to easily produce an active structure having an amplification function in each pixel. The CMOS image sensor also has characteristics that allow to integrate peripheral circuit units, such as a drive circuit that drives a pixel array unit and a signal processing circuit that processes a signal output from each pixel of the pixel array unit, on the same chip (substrate) as the chip of the pixel array unit. Therefore, the CMOS image sensor is drawing attention, and the CMOS is studied and developed much.

Also, as a method of accumulating and reading the charge of the CMOS image sensor, a structure is generally adopted in which the charge is accumulated in a PD (photodiode), a transfer transistor is used to transfer the charge to an FD (Floating Diffusion) unit including a floating diffusion layer with a predetermined amount of charge accumulation, and the charge is read.

In recent years, a structure is proposed as disclosed in PTL 1, PTL 2, and a fourth embodiment of PTL 3, in which a photoelectric conversion unit of the CMOS image sensor is arranged on an upper part of a semiconductor substrate, and photoelectric conversion signals are accumulated in the semiconductor substrate.

CITATION LIST

Patent Literature

[PTL 1]
   JP 2007-329161A
[PTL 2]
   JP 2010-278086A
[PTL 3]
   JP 2011-138927A

SUMMARY

Technical Problem

Incidentally, in the CMOS image sensor, defect sources, such as metal impurities, occasionally gather in a high concentration impurity diffusion layer constituting the FD unit that accumulates the charge in a manufacturing process. Therefore, noise may be generated in the FD unit, and imaging characteristics may be deteriorated by white points, white scratches, black points, and the like appearing in an image taken by the CMOS image sensor. This may reduce the image quality.

The present disclosure is made in view of the circumstances, and the present disclosure can further improve the image quality.

Solution to Problem

An imaging device according to an aspect of the present disclosure includes a photoelectric conversion unit that receives and photoelectrically converts light, a floating diffusion layer that accumulates charge generated by the photoelectric conversion unit, and a diffusion layer that serves as a source or a drain of a transistor. The floating diffusion layer is formed to have an impurity concentration lower than an impurity concentration of the diffusion layer.

A manufacturing method according to an aspect of the present disclosure is a manufacturing method of an imaging device including a photoelectric conversion unit that receives and photoelectrically converts light, a floating diffusion layer that accumulates charge generated by the photoelectric conversion unit, and a diffusion layer that serves as a source or a drain of a transistor. The manufacturing method separately includes a step of forming the floating diffusion layer, and a step of forming the diffusion layer. The floating diffusion layer is formed to have an impurity concentration lower than an impurity concentration of the diffusion layer.

A semiconductor device according to an aspect of the present disclosure includes a floating diffusion layer that accumulates charge, and a diffusion layer that serves as a source or a drain of a transistor. The floating diffusion layer is formed to have an impurity concentration lower than an impurity concentration of the diffusion layer.

An electronic device according to an aspect of the present disclosure includes an imaging device. The imaging device includes a photoelectric conversion unit that receives and photoelectrically converts light, a floating diffusion layer that accumulates charge generated by the photoelectric conversion unit, and a diffusion layer that serves as a source or a drain of a transistor. The floating diffusion layer is formed to have an impurity concentration lower than an impurity concentration of the diffusion layer.

In an aspect of the present disclosure, with regard to a floating diffusion layer that accumulates charge and a diffusion layer that serves as a source or a drain of a transistor, the floating diffusion layer is formed to have an impurity concentration lower than an impurity concentration of the diffusion layer.

Advantageous Effect of Invention

According to an aspect of the present disclosure, the image quality can be further improved.

DESCRIPTION OF EMBODIMENTS

Hereinafter, specific embodiments applying the present technology is described in detail with reference to the drawings.

<Configuration Example of Imaging Device>

Figure 1:
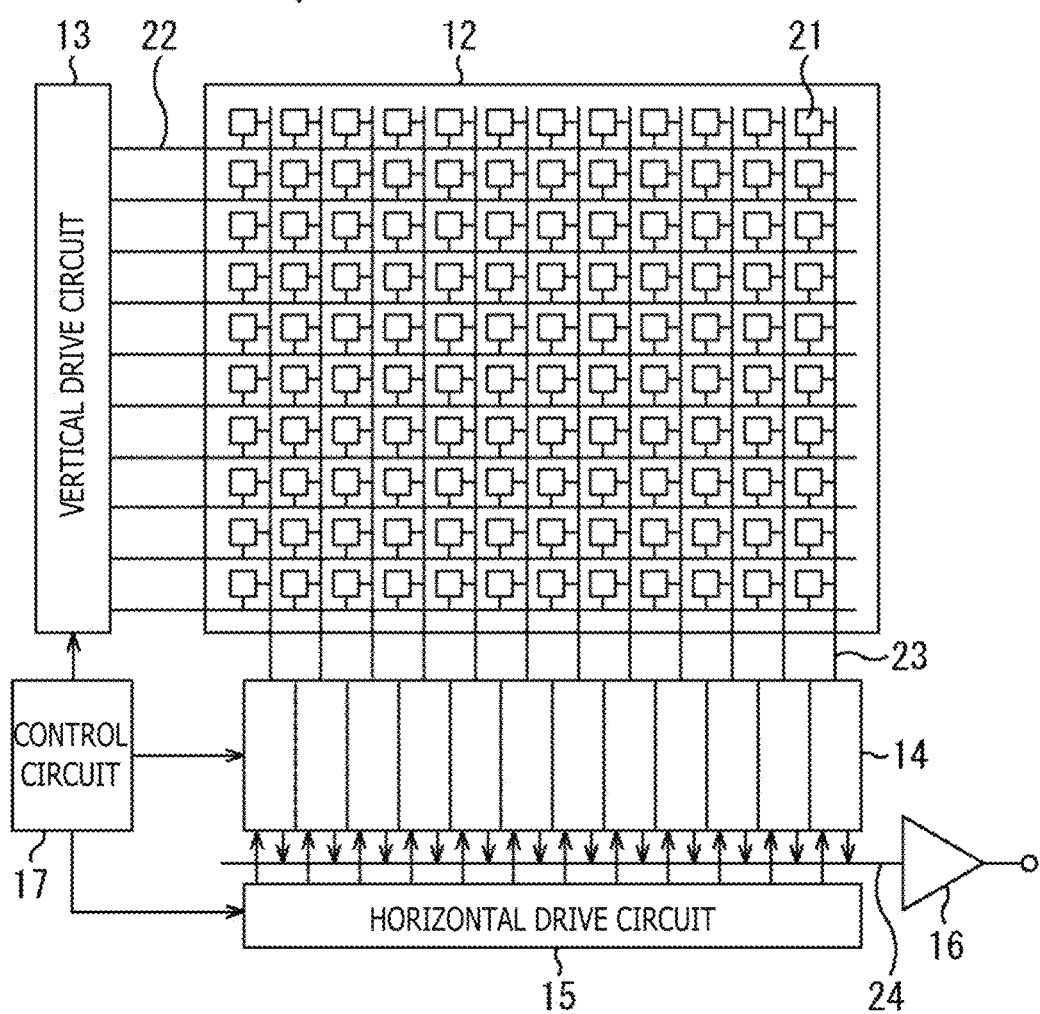
FIG. 1 is a block diagram depicting a configuration example of an embodiment of an imaging device applying the present technology.

FIG. 1 is a block diagram depicting a configuration example of an embodiment of an imaging device applying the present technology.

As depicted in FIG. 1, an imaging device 11 includes a pixel area 12, a vertical drive circuit 13, a column signal processing circuit 14, a horizontal drive circuit 15, an output circuit 16, and a control circuit 17.

The pixel area 12 is a light receiving surface for receiving light condensed by an optical system not depicted. A plurality of pixels 21 are arranged in a matrix in the pixel area 12. Each of the pixels 21 is connected to the vertical drive circuit 13 through a horizontal signal line 22 in each row, and each of the pixels 21 is connected to the column signal processing circuit 14 through a vertical signal line 23 in each column. Each of the plurality of pixels 21 outputs a pixel signal of a level according to an amount of received light, and an image of a subject formed in the pixel area 12 is constructed from the pixel signals.

For each row of the plurality of pixels 21 arranged in the pixel area 12, the vertical drive circuit 13 sequentially supplies drive signals for driving (transferring, selecting, resetting, and so forth) the pixels 21 to the pixels 21 through the horizontal signal lines 22.

The column signal processing circuit 14 applies a CDS (Correlated Double Sampling) process to pixel signals output from the plurality of pixels 21 through the vertical signal lines 23 to thereby perform AD (Analog to Digital) conversion of the pixel signals and removes reset noise.

For each column of the plurality of pixels 21 arranged in the pixel area 12, the horizontal drive circuit 15 sequentially supplies, to the column signal processing circuit 14, drive signals for causing the column signal processing circuit 14 to output pixel signals to a data output signal line 24.

The output circuit 16 amplifies, to predetermined levels, the pixel signals supplied from the column signal processing circuit 14 through the data output signal line 24 at the timing according to the drive signals of the horizontal drive circuit 15 and outputs the pixel signals.

The control circuit 17 generates and supplies clock signals according to drive periods of the respective blocks constituting the imaging device 11 to thereby control the drive of the respective blocks.

The imaging device 11 is constituted in this way, and the pixel signals according to the amounts of light received by the pixels 21 are sequentially output to a signal processing circuit not depicted of a later stage. The imaging device 11 can also have, for example, a back-illuminated structure in which light is applied to a back side facing the opposite side of a front side of a semiconductor substrate formed with PDs of the pixels 21.

<First Configuration Example of Pixel>

Figure 2:
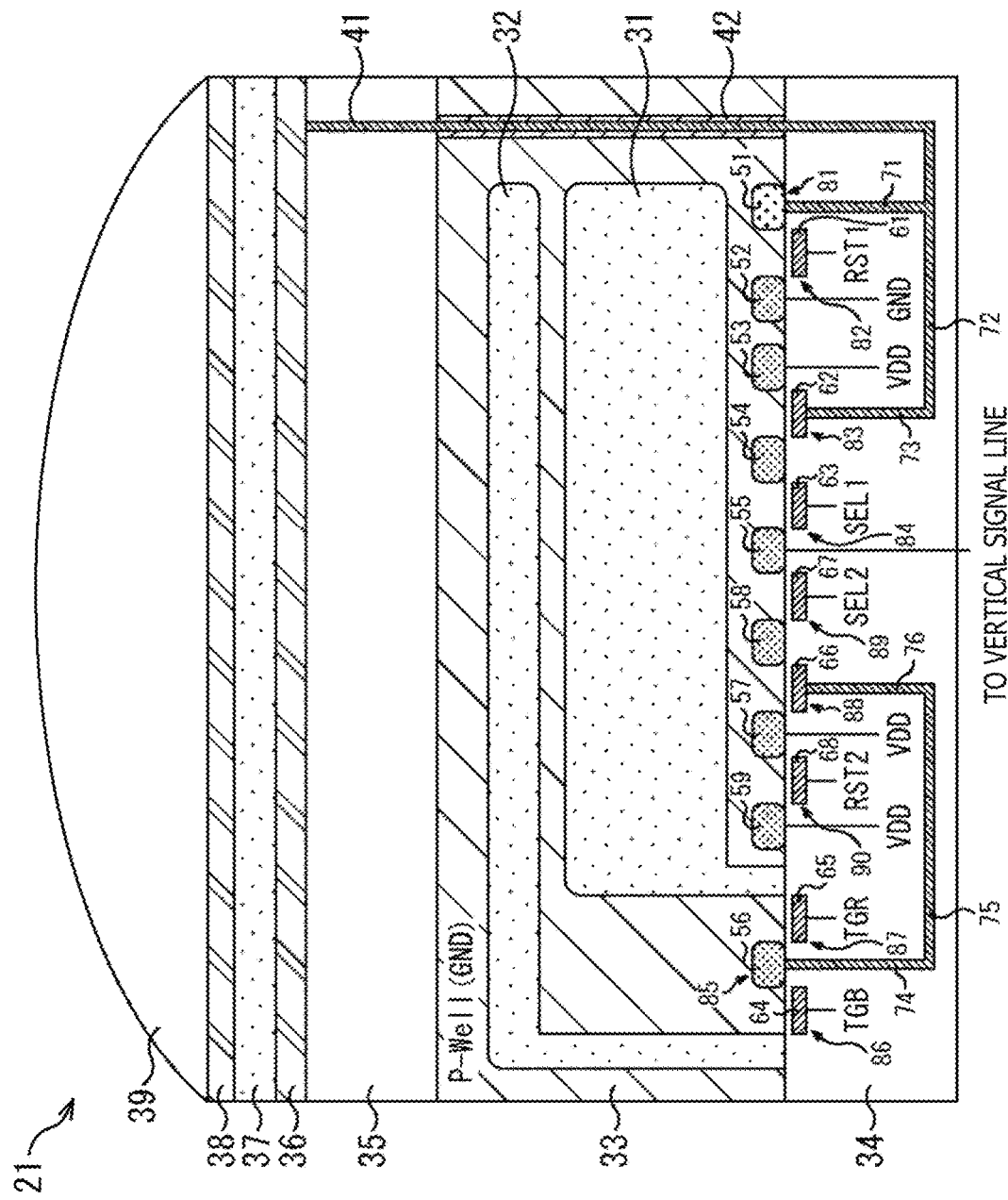
FIG. 2 is a diagram depicting a first configuration example of a pixel.

Next, FIG. 2 is a diagram depicting a first configuration example of the pixel 21.

As depicted in FIG. 2, the pixel 21 is constituted by laminating a wiring layer 34 on a front side (surface facing downward in FIG. 2) of a semiconductor substrate 33 provided with a red PD 31 and a blue PD 32 and laminating an insulating film 35, a lower electrode 36, a green photoelectric conversion film 37, an upper electrode 38, and an on-chip lens 39 on a back side (surface facing upward in FIG. 2) of the semiconductor substrate 33.

The red PD 31 is a photoelectric conversion unit including a PN junction of an N-type diffusion layer and a P-type diffusion layer formed in a relatively deep area on the back side of the semiconductor substrate 33, and the red PD 31 photoelectrically converts and accumulates red light. The blue PD 32 is a photoelectric conversion unit including a PN junction of an N-type diffusion layer and a P-type diffusion layer formed in a relatively shallow area on the back side of the semiconductor substrate 33, and the blue PD 32 photoelectrically converts and accumulates blue light.

The semiconductor substrate 33 is, for example, a plate-like wafer including thinly sliced single crystal silicon. The front side of the semiconductor substrate 33 is provided with a plurality of N-type diffusion layers as described later and provided with a plurality of transistors that control flows of currents according to voltages applied to gate electrodes, with the N-type diffusion layers serving as sources or drains.

The wiring layer 34 is provided with a plurality of wires for transmitting drive signals for driving the pixels 21, pixel signals output from the pixels 21, and the like in layers through an interlayer insulating film.

The insulating film 35 insulates the back side of the semiconductor substrate 33.

The lower electrodes 36 and 38 are formed by a conductive transparent material and are laminated so as to sandwich the green photoelectric conversion film 37.

The green photoelectric conversion film 37 absorbs and photoelectrically converts green light and is formed by an organic material that transmits light other than the green light. Charge generated by the green photoelectric conversion film 37 is sequentially taken out through a contact electrode 41 connected to the lower electrode 36, and the contact electrode 41 is insulated by an insulating film 42 at a part penetrating through the semiconductor substrate 33.

The on-chip lens 39 condenses light applied to the pixel 21.

The pixel 21 configured in this way has a longitudinal spectral structure in which the red PD 31, the blue PD 32, and the green photoelectric conversion film 37 are arranged in a longitudinal direction along an illumination direction of the light applied to the pixel 21. In addition, red, blue, and green light can be photoelectrically converted in one pixel 21.

The imaging device 11 with the structure using the pixels 21 of the longitudinal spectral structure can suppress a reduction in the sensitivity caused by light absorption of color filters compared to, for example, a structure with a pixel array including red, blue, and green color filters arranged in a plane. Furthermore, the configuration of using the pixels 21 of the longitudinal spectral structure does not require an interpolation process, and an advantageous effect of avoiding generation of a false color can be expected.

Here, the semiconductor substrate 33 (P-Well) is connected to a reference potential. N-type diffusion layers 51 to 59 are formed on the front side of the semiconductor substrate 33, and gate electrodes 61 to 68 are formed on the front side of the semiconductor substrate 33 through an insulating film.

A contact electrode 71 is connected to the N-type diffusion layer 51 at an interface between the semiconductor substrate 33 and the wiring layer 34, and the N-type diffusion layer 51 is connected to the lower electrode 36 through the contact electrode 71, a wire 72, and the contact electrode 41. More specifically, the N-type diffusion layer 51 constitutes an FD unit 81 that accumulates charge generated by the green photoelectric conversion film 37.

The N-type diffusion layer 52 is connected to a reference potential (GND).

In addition, the N-type diffusion layers 51 and 52, along with the gate electrode 61 arranged between the N-type diffusion layers 51 and 52, constitute a reset transistor 82 that resets the FD unit 81. More specifically, the reset transistor 82 is driven according to a reset signal RST1 supplied from the vertical drive circuit 13 to output the charge accumulated in the N-type diffusion layer 51 to the reference potential (GND) to reset the FD unit 81.

The N-type diffusion layer 53 is connected to a drain power supply VDD. The N-type diffusion layers 53 and 54, along with the gate electrode 62 arranged between the N-type diffusion layers 53 and 54, constitute an amplifier transistor 83 that amplifies the charge accumulated in the FD unit 81. More specifically, the gate electrode 62 is connected to the FD unit 81 through a contact electrode 73, the wire 72, and the contact electrode 71, and potential of level according to the charge accumulated in the FD unit 81 is applied to the gate electrode 62. As a result, the charge accumulated in the FD unit 81 is amplified by the amplifier transistor 83 and converted into a pixel signal.

The N-type diffusion layer 55 is connected to the vertical signal line 23. The N-type diffusion layers 54 and 55, along with the gate electrode 63 arranged between the N-type diffusion layers 54 and 55, constitute a selection transistor 84 that selects the pixel 21 at a timing of outputting a pixel signal. More specifically, the selection transistor 84 is driven according to a selection signal SEL1 supplied from the vertical drive circuit 13 to connect the amplifier transistor 83 to the vertical signal line 23.

The N-type diffusion layer 56 constitutes an FD unit 85 that accumulates each charge generated by the red PD 31 and the charge generated by the blue PD 32.

The N-type diffusion layer 56, along with the gate electrode 64 arranged between the N-type diffusion layer 56 and part of the blue PD 32 extending to the front side of the semiconductor substrate 33, also constitutes a transfer transistor 86 that transfers the charge generated by the blue PD 32 to the FD unit 85. More specifically, the transfer transistor 86 is driven according to a transfer signal TGB supplied from the vertical drive circuit 13 to transfer the charge accumulated in the blue PD 32 to the FD unit 85.

Similarly, the N-type diffusion layer 56, along with the gate electrode 65 arranged between the N-type diffusion layer 56 and part of the red PD 31 extending to the front side of the semiconductor substrate 33, constitutes a transfer transistor 87 that transfers the charge generated by the red PD 31 to the FD unit 85. More specifically, the transfer transistor 87 is driven according to a transfer signal TGR supplied from the vertical drive circuit 13 to transfer the charge accumulated in the red PD 31 to the FD unit 85.

In addition, the N-type diffusion layer 56 constituting the FD unit 85 is connected to the gate electrode 66 arranged between the N-type diffusion layers 57 and 58 through a contact electrode 74, a wire 75, and a contact electrode 76.

The N-type diffusion layers 57 and 58, along with the gate electrode 66 arranged between the N-type diffusion layers 57 and 58, constitute an amplifier transistor 88 that amplifies the charge accumulated in the FD unit 85. More specifically, potential of level according to the charge accumulated in the FD unit 85 is applied to the gate electrode 66 of the amplifier transistor 88, and the charge is amplified by the amplifier transistor 88 and converted into a pixel signal.

The N-type diffusion layer 59 is connected to the drain power supply VDD, and the N-type diffusion layer 59, along with the N-type diffusion layer 56 and the gate electrode 68, constitutes a reset transistor 90 that resets the FD unit 85. More specifically, the reset transistor 90 is driven according to a reset signal RST2 supplied from the vertical drive circuit 13 to output the charge accumulated in the N-type diffusion layer 56 to the drain power supply VDD to reset the FD unit 85.

In this way, the pixel 21 is formed such that the impurity concentration of the N-type diffusion layer 51 that accumulates the charge generated by the green photoelectric conversion film 37 among the N-type diffusion layers 51 to 59 provided on the front side of the semiconductor substrate 33 is a concentration lower than that of the other N-type diffusion layers 52 to 59. In this way, the impurity concentration of the N-type diffusion layer 51 can be set to a low concentration to prevent defect sources, such as metal impurities contained in the semiconductor substrate 33, from gathering in the N-type diffusion layer 51 and to avoid degradation of imaging characteristics.

Specifically, it is preferable to set the impurity concentration of the N-type diffusion layer 51 to 1e18 to 1e20/cm3 and set the impurity concentrations of the N-type diffusion layers 52 to 59 to 1e20/cm3 or more.

Therefore, white points, white scratches, black points, and the like are not generated in the image taken by the imaging device 11 including the pixels 21, and the image quality can be higher than that in conventional imaging devices. Furthermore, advantageous effects of improving the marketability of the imaging device 11 and improving the yield can be expected.

Furthermore, the pixel 21 has a structure in which the red PD 31 and the blue PD 32 that can accumulate charge and the green photoelectric conversion film 37, from which the charge is sequentially taken out and accumulated in the FD unit 81, exist on the same semiconductor substrate 33. In such a configuration, it is preferable to set the impurity concentration of the FD unit 81 that accumulates the charge of the green photoelectric conversion film 37 to a concentration relatively lower than that of the FD unit 85 that receives the charge generated by the red PD 31 and the blue PD 32. This can prevent the defect sources from gathering in the FD unit 81. Particularly, the accumulation time of charge is long in the structure of accumulating the charge in the FD unit 81, and the advantageous effect of preventing the defect sources from gathering in the FD unit 81 can be large.

Next, steps of forming N-type diffusion layers with different impurity concentrations in a manufacturing method of the imaging device 11 including the pixels 21 are described with reference to FIGS. 3 to 9.

Figure 3:
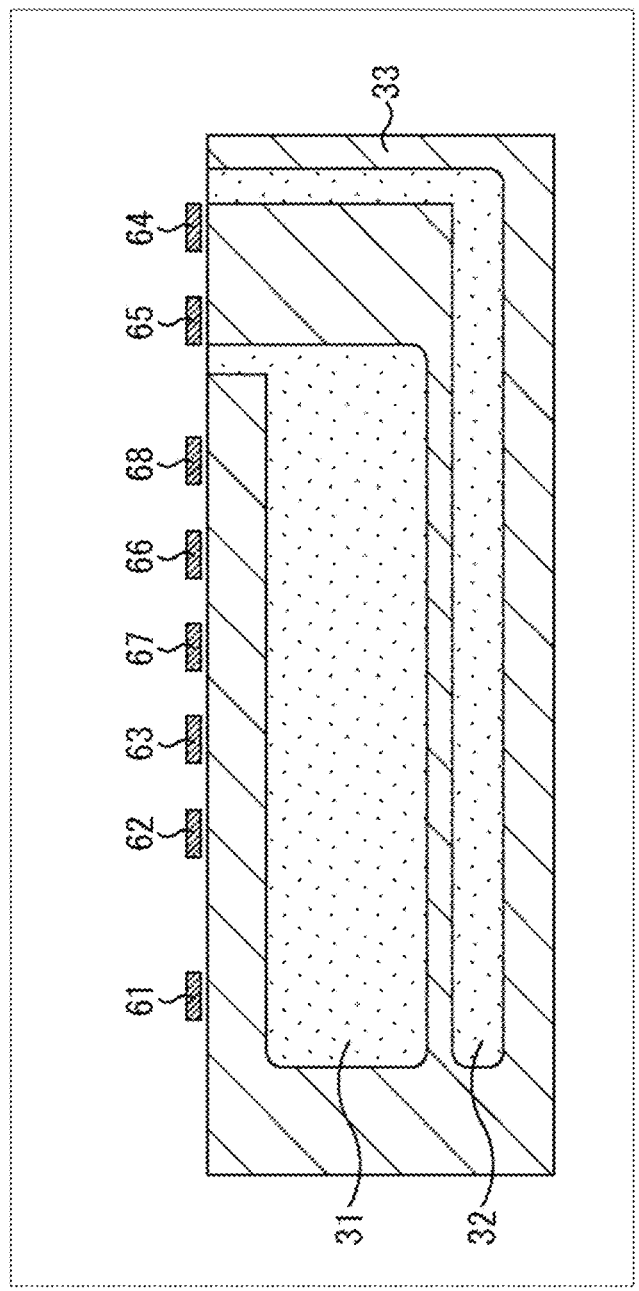
FIG. 3 is a diagram describing a first step.

First, as depicted in FIG. 3, ion implantation of N-type and P-type impurities is applied to the semiconductor substrate 33 to form the red PD 31 and the blue PD 32, and the gate electrodes 61 to 68 are formed on the front side of the semiconductor substrate 33 through the insulating film in a first step.

Figure 4:
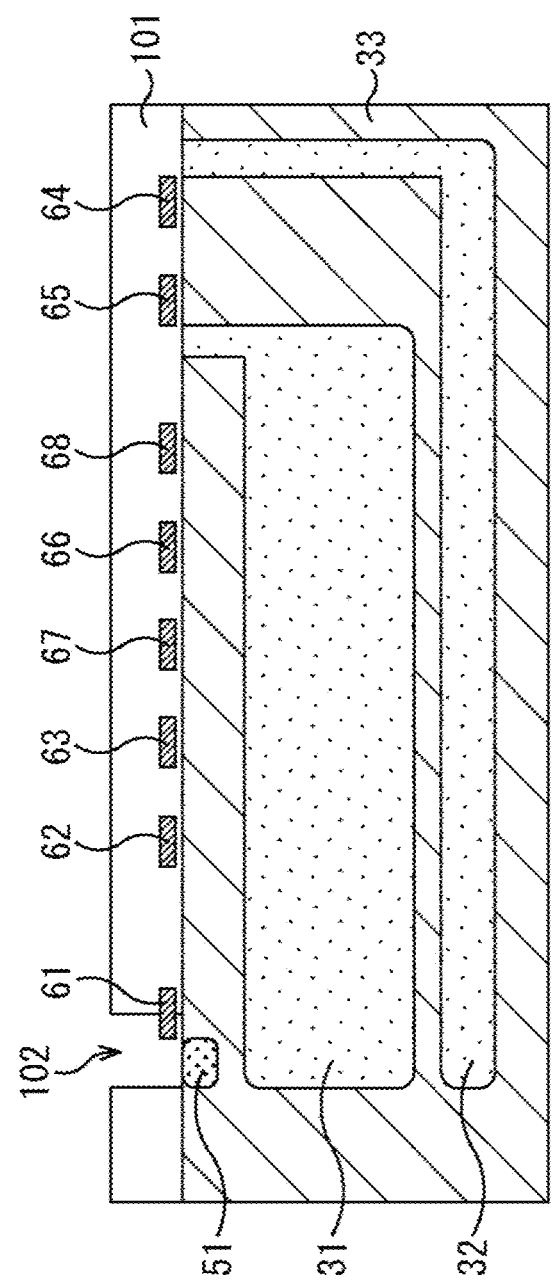
FIG. 4 is a diagram describing a second step.

Subsequently, as depicted in FIG. 4, a resist 101 is deposited on the front side of the semiconductor substrate 33, and an opening 102 is formed in an area provided with the N-type diffusion layer 51 in a second step. Ion implantation of N-type impurities is then applied through the opening 102 to form the N-type diffusion layer 51. In this case, the gate electrode 61, along with the opening 102, is used as part of a pattern defining the area for forming the N-type diffusion layer 51.

Figure 5:
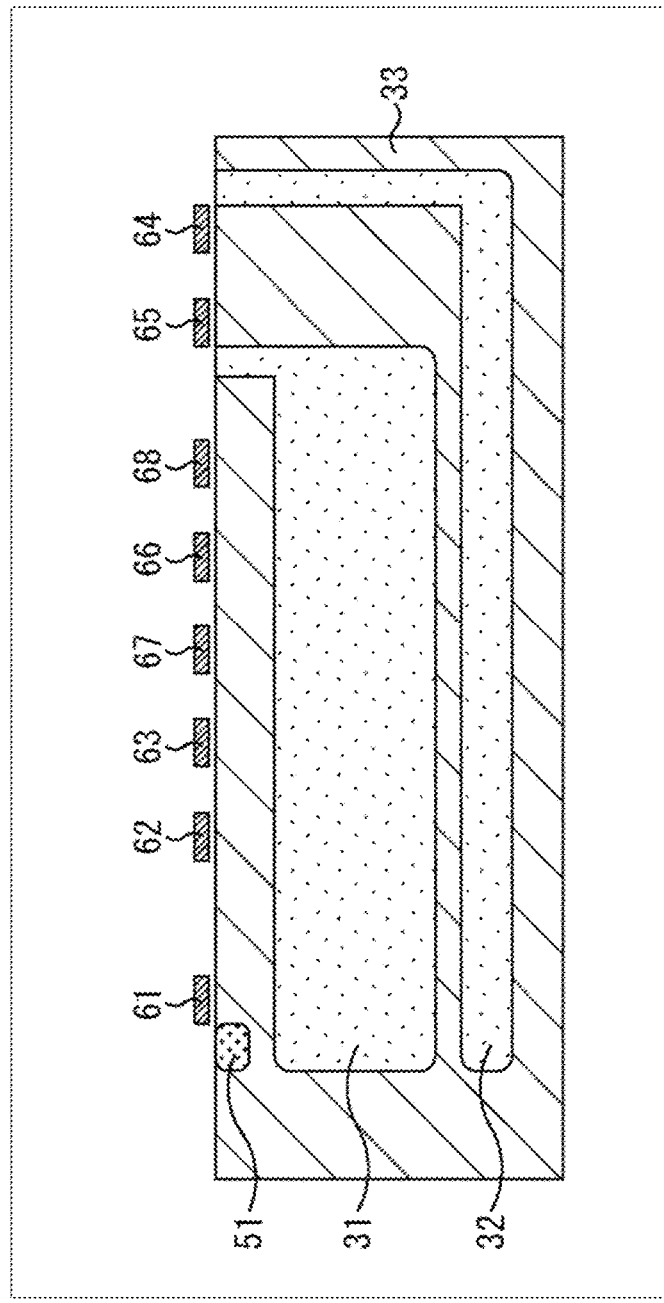
FIG. 5 is a diagram describing a third step.

Then, as depicted in FIG. 5, the resist 101 is removed from the front side of the semiconductor substrate 33 in a third step.

Figure 6:
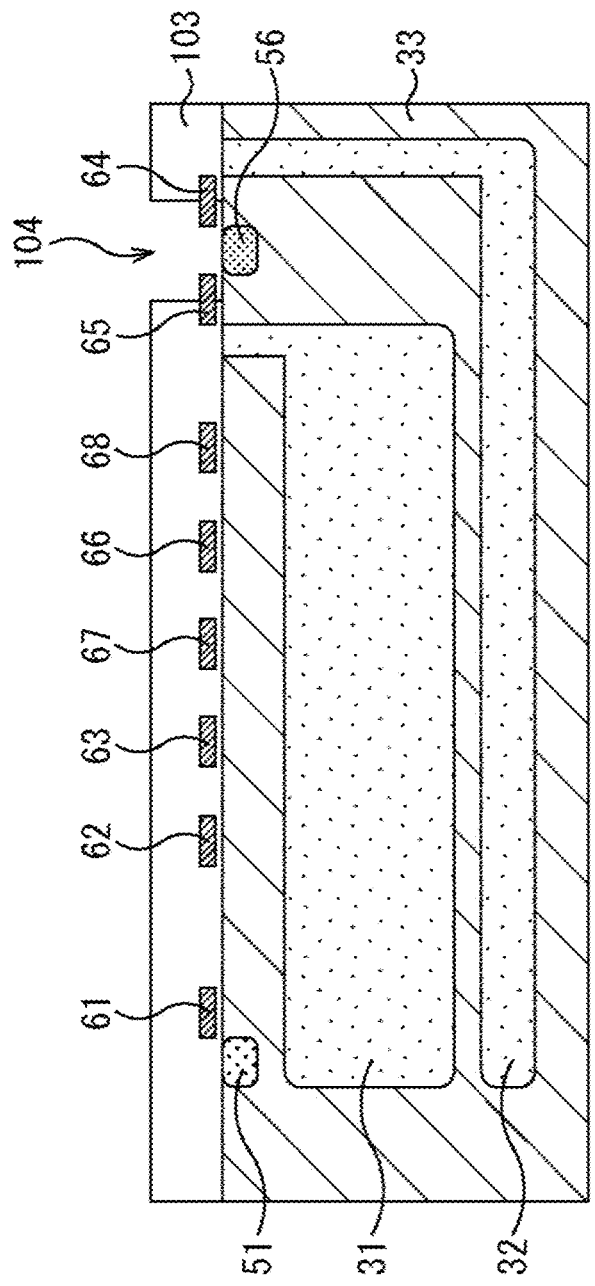
FIG. 6 is a diagram describing a fourth step.

Next, as depicted in FIG. 6, a resist 103 is deposited on the front side of the semiconductor substrate 33, and an opening 104 is formed in an area provided with the N-type diffusion layer 56 in a fourth step. Ion implantation of N-type impurities is then applied through the opening 104 to form the N-type diffusion layer 56. In this case, the gate electrodes 64 and 65, along with the opening 104, are used as part of a pattern defining the area for forming the N-type diffusion layer 56.

Figure 7:
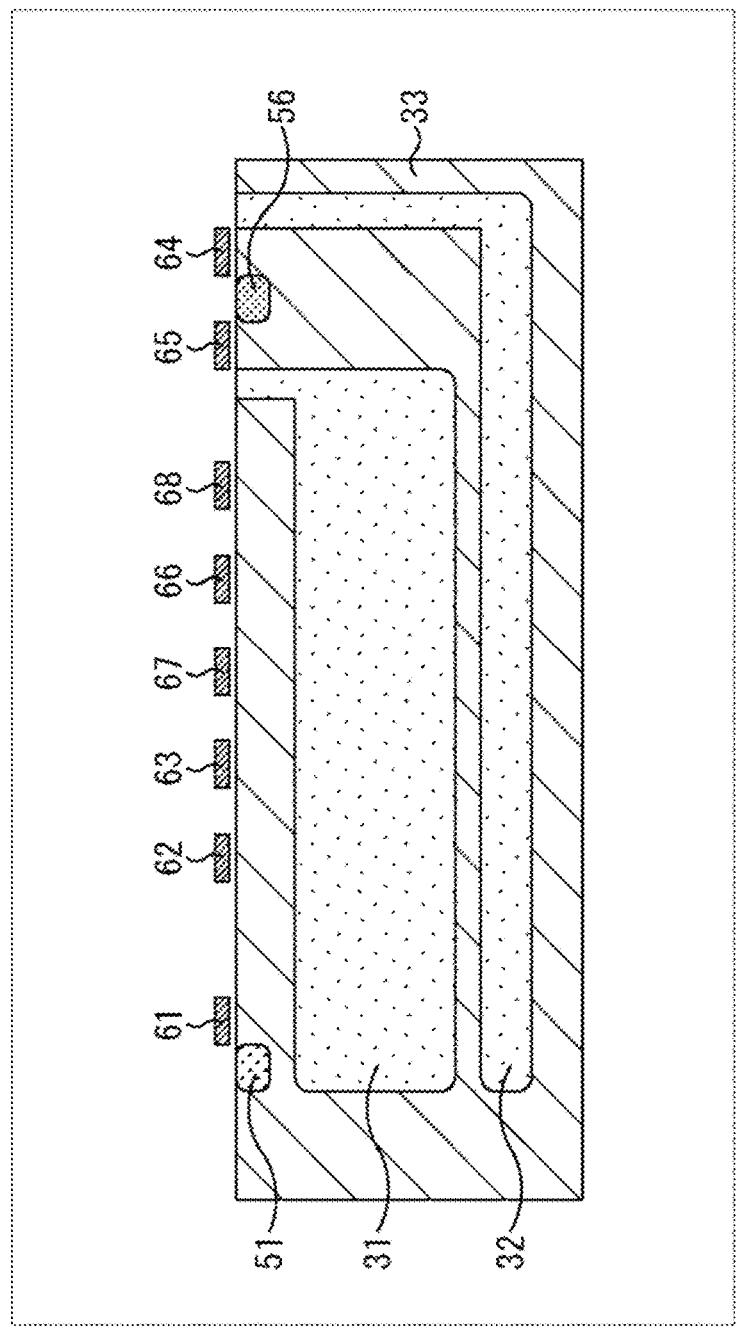
FIG. 7 is a diagram describing a fifth step.

Then, as depicted in FIG. 7, the resist 103 is removed from the front side of the semiconductor substrate 33 in a fifth step.

Figure 8:
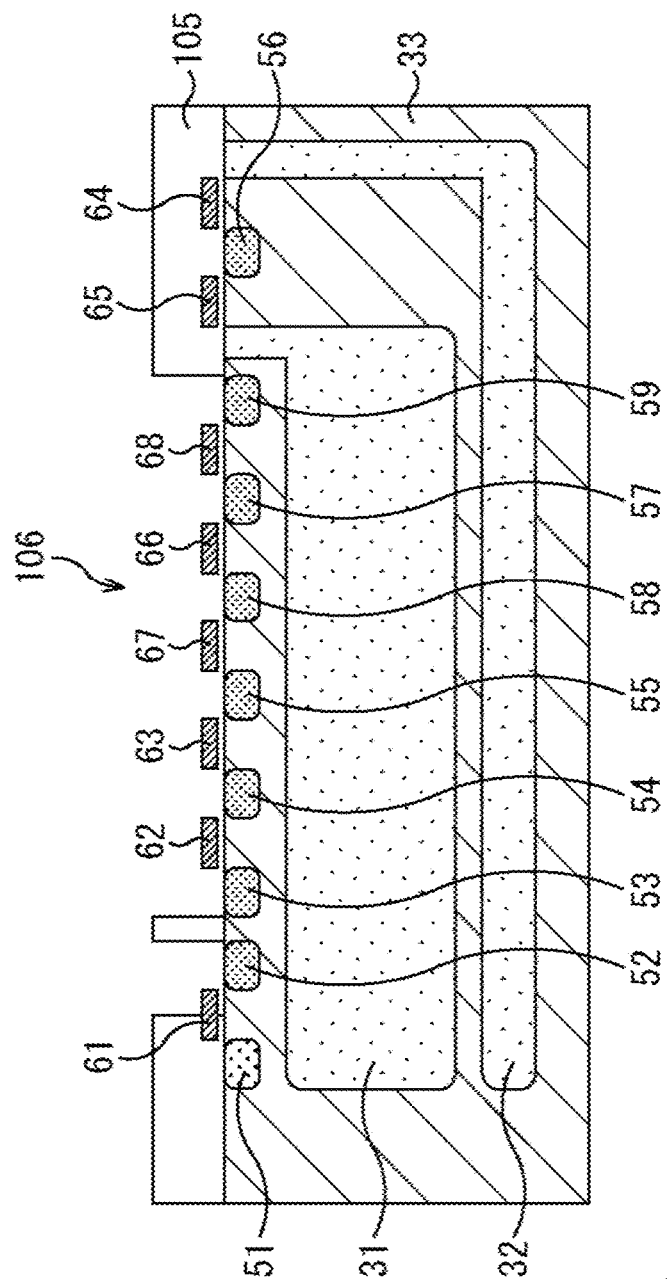
FIG. 8 is a diagram describing a sixth step.

Subsequently, as depicted in FIG. 8, a resist 105 is deposited on the front side of the semiconductor substrate 33, and an opening 106 is formed in an area provided with the N-type diffusion layers 52 to 55 and the N-type diffusion layers 57 to 59 in a sixth step. Ion implantation of N-type impurities is then applied through the opening 104 to form the N-type diffusion layers 52 to 55 and the N-type diffusion layers 57 to 59. In this case, the gate electrodes 61 to 63 and the gate electrodes 66 to 68, along with the opening 106, are used as part of a pattern defining the area for forming the N-type diffusion layers 52 to 55 and the N-type diffusion layers 57 to 59.

Figure 9:
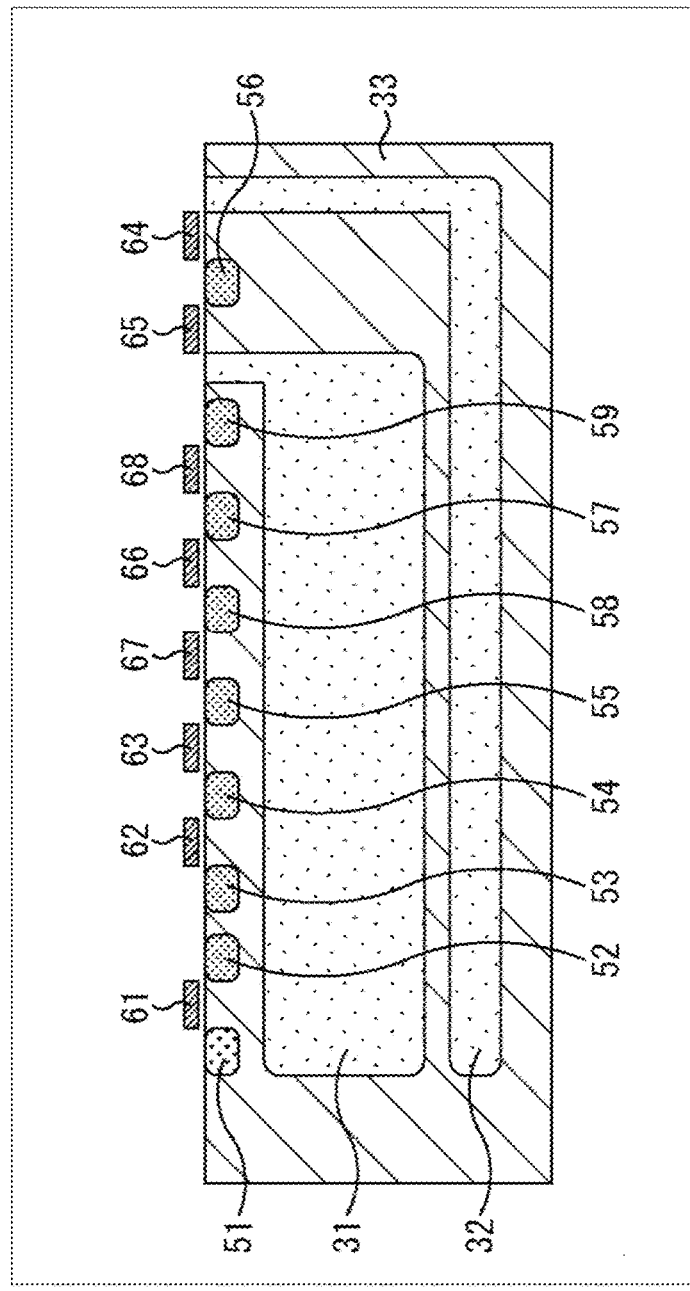
FIG. 9 is a diagram describing a seventh step.

Subsequently, as depicted in FIG. 9, the resist 105 is removed from the front side of the semiconductor substrate 33 in a seventh step.

As described above, the N-type diffusion layer 51, the N-type diffusion layer 56, the N-type diffusion layers 52 to 55, and the N-type diffusion layers 57 to 59 are each formed in different steps in the first to seventh steps. Therefore, the impurity concentration in forming the N-type diffusion layer 51 can be set to a concentration lower than the impurity concentration in forming the N-type diffusion layer 56, the N-type diffusion layers 52 to 55, and the N-type diffusion layers 57 to 59 to thereby manufacture the imaging device 11 including the pixels 21 as described with reference to FIG. 2.

Note that in the manufacturing method, the impurity concentration of the N-type diffusion layer 56 can also be set to a concentration different from the N-type diffusion layers 52 to 55 and the N-type diffusion layers 57 to 59, such as a concentration lower than that of the N-type diffusion layers 52 to 55 and the N-type diffusion layers 57 to 59.

<Modification of Pixel>

Next, a modification of the pixel 21 is described with reference to FIG. 10.

Figure 10:
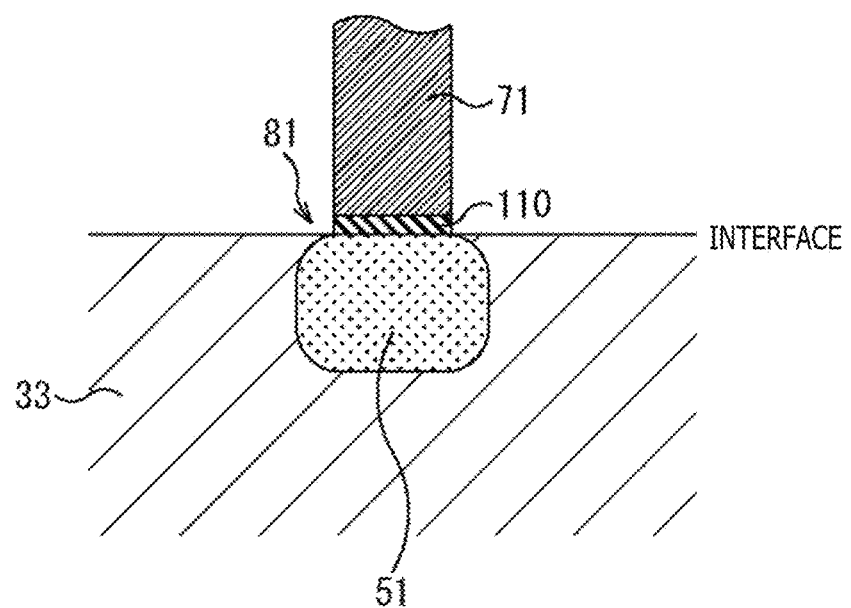
FIG. 10 is a diagram describing a modification of the pixel.

A junction part of the N-type diffusion layer 51 and the contact electrode 71 in the FD unit 81 of the pixel 21 is enlarged and illustrated in FIG. 10.

As described above, in the pixel 21, the contact electrode 71 is connected to the N-type diffusion layer 51 constituting the FD unit 81 that accumulates the charge generated by the green photoelectric conversion film 37, at the interface between the semiconductor substrate 33 and the wiring layer 34.

Although the configuration of directly connecting the contact electrode 71 to the N-type diffusion layer 51 may be adopted in the pixel 21, a configuration of connecting the contact electrode 71 to the N-type diffusion layer 51 through an insulator 110 can be adopted as depicted, for example, in FIG. 10. For example, the insulator 110 is laminated on the N-type diffusion layer 51 by using a PVD (Physical Vapor Deposition) method of depositing a thin film on the front side of the semiconductor substrate 33. Materials, such as SrTiO3, ZrO2, TiO2, La2O3, Y2O3, HfO2, Ta2O3, HFSiO4, and Al2O3, can be used for the insulator 110 formed between the N-type diffusion layer 51 and the contact electrode 71.

Providing the insulator 110 can avoid forming a Schottky junction when the N-type diffusion layer 51 and the contact electrode 71 are joined in the pixel 21.

The avoidance of the Schottky junction is described with reference to FIGS. 11A and 11B.

Figure 11A:
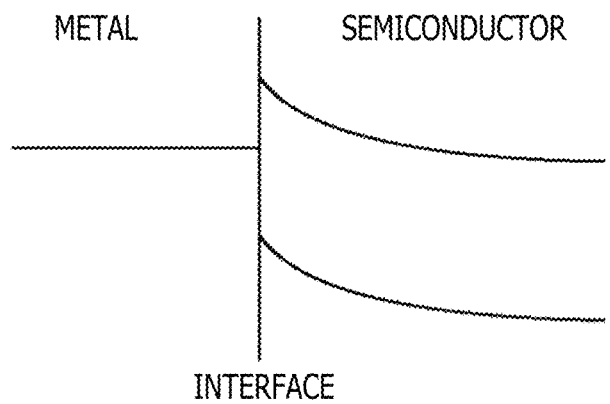
FIGS. 11A and 11B is a are diagrams describing avoidance of a Schottky junction.

FIG. 11A depicts a band diagram in the configuration of directly connecting the contact electrode 71 to the N-type diffusion layer 51. FIG. 11B depicts a band diagram in the configuration of connecting the contact electrode 71 to the N-type diffusion layer 51 through the insulator 110.

For example, when the concentration of the N-type diffusion layer 51 of the FD unit 81 is further reduced, the contact electrode 71 and the N-type diffusion layer 51 form a Schottky junction. There is a Schottky barrier as depicted in FIG. 11A, and an increase in the contact resistance becomes apparent.

Figure 11B:
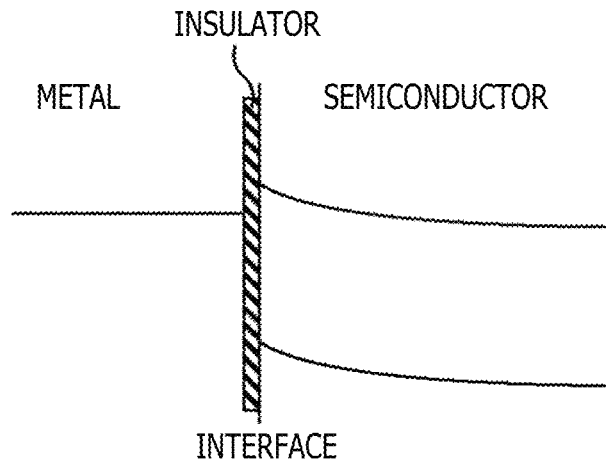

In contrast, when the insulator 110 is arranged between the N-type diffusion layer 51 and the contact electrode 71 as depicted in FIG. 11B, the communication between the N-type diffusion layer 51 and the contact electrode 71 is controlled by a tunneling current through the insulator 110. This reduces the depletion layer area of the N-type diffusion layer 51. The Schottky barrier is also reduced, and the resistance value is reduced.

In this way, the arrangement of the insulator 110 can realize further reduction in the concentration of the N-type diffusion layer 51 of the FD unit 81.

In this way, the insulator 110 can be provided to avoid the Schottky junction in the pixel 21. Therefore, the impurity concentration of the N-type diffusion layer 51 of the FD unit 81 that accumulates the charge generated by the green photoelectric conversion film 37 can be set further low in the pixel 21 compared to the structure not provided with the insulator 110. Specifically, the impurity concentration of the FD unit 81 can be set to approximately 1e17 to 1e19/cm3.

<Second Configuration Example of Pixel>

Figure 12:
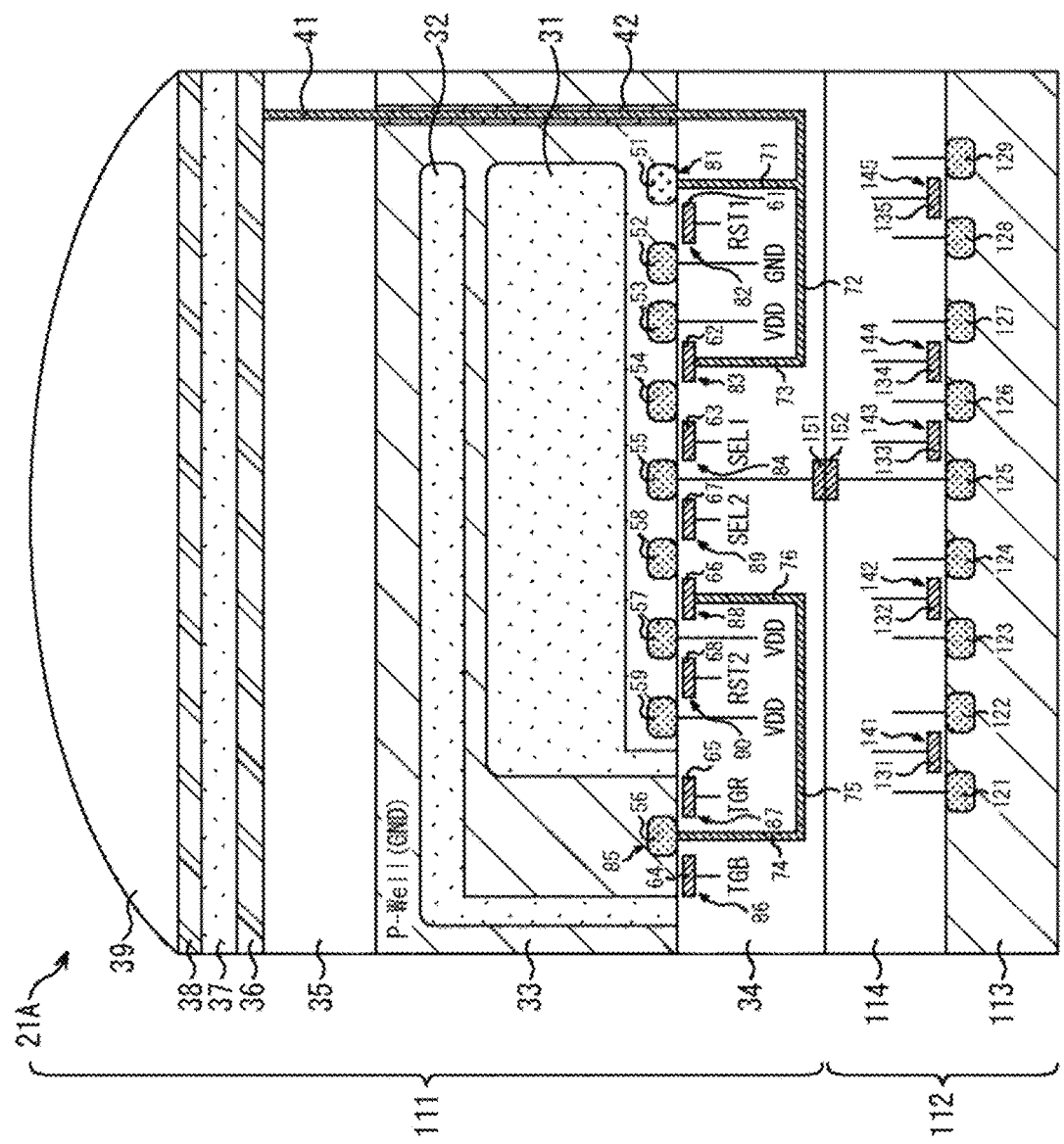
FIG. 12 is a diagram depicting a second configuration example of the pixel.

Next, FIG. 12 is a diagram depicting a second configuration example of the pixel 21.

In a pixel 21A depicted in FIG. 12, the same reference signs are provided to the components in common with the pixel 21 of FIG. 2, and the detailed description is not repeated.

FIG. 2 described above depicts the pixel 21 on a sensor chip 111 in which the wiring layer 34 is laminated on the front side of the semiconductor substrate 33, and the insulating film 35, the lower electrode 36, the green photoelectric conversion film 37, the upper electrode 38, and the on-chip lens 39 are laminated on the back side of the semiconductor substrate 33. In contrast, FIG. 12 depicts the pixel 21A of a multi-layer imaging device in which a logic chip 112 is mechanically and electrically pasted on the front side of the sensor chip 111. Note that the components in the sensor chip 111 of the pixel 21A are the same as in the pixel 21 of FIG. 2.

The logic chip 112 is constituted by laminating a wiring layer 114 on a semiconductor substrate 113, and a plurality of transistors with various functions are formed on a front side (surface facing upward in FIG. 12) of the semiconductor substrate 113. Then, the logic chip 112 can control the drive of the sensor chip 111 and execute various types of arithmetic processing, such as image processing for a pixel signal output from the sensor chip 111.

More specifically, N-type diffusion layers 121 to 129 are formed on the front side of the semiconductor substrate 113, and gate electrodes 131 to 135 are formed on the front side of the semiconductor substrate 113 through an insulating film. The N-type diffusion layers 121 and 122 then constitute a transistor 141 along with the gate electrode 131 arranged between the N-type diffusion layers 121 and 122, and the N-type diffusion layers 123 and 124 constitute a transistor 142 along with the gate electrode 132 arranged between the N-type diffusion layers 123 and 124. Hereinafter, transistors 143 to 145 are similarly formed by the N-type diffusion layers 125 to 129 and the gate electrodes 133 to 135.

Furthermore, electrode pads 151 and 152 are used for electrical connection in the pixel 21A. For example, in the pixel 21A, the N-type diffusion layer 55 is connected to the electrode pad 151, and the N-type diffusion layer 125 is connected to the electrode pad 152. The N-type diffusion layer 55 and the N-type diffusion layer 125 are connected through the electrode pads 151 and 152.

In the pixel 21A configured in this way, the impurity concentration of the N-type diffusion layer 51 is also set to a concentration lower than the impurity concentration of the N-type diffusion layers 121 to 129 provided on the logic chip 112 similar to the pixel 21 of FIG. 2. For example, although defects may move inside of the semiconductor substrate 33 and the semiconductor substrate 113 in heat treatment for joining the sensor chip 111 and the logic chip 112, gathering of the defects in the N-type diffusion layer 51 can be avoided.

Therefore, white points, white scratches, black points, and the like are not generated in the image taken by the imaging device 11 including the pixels 21A, and the image quality can be higher than that in conventional imaging devices.

<Third Configuration Example of Pixel>

Figure 13:
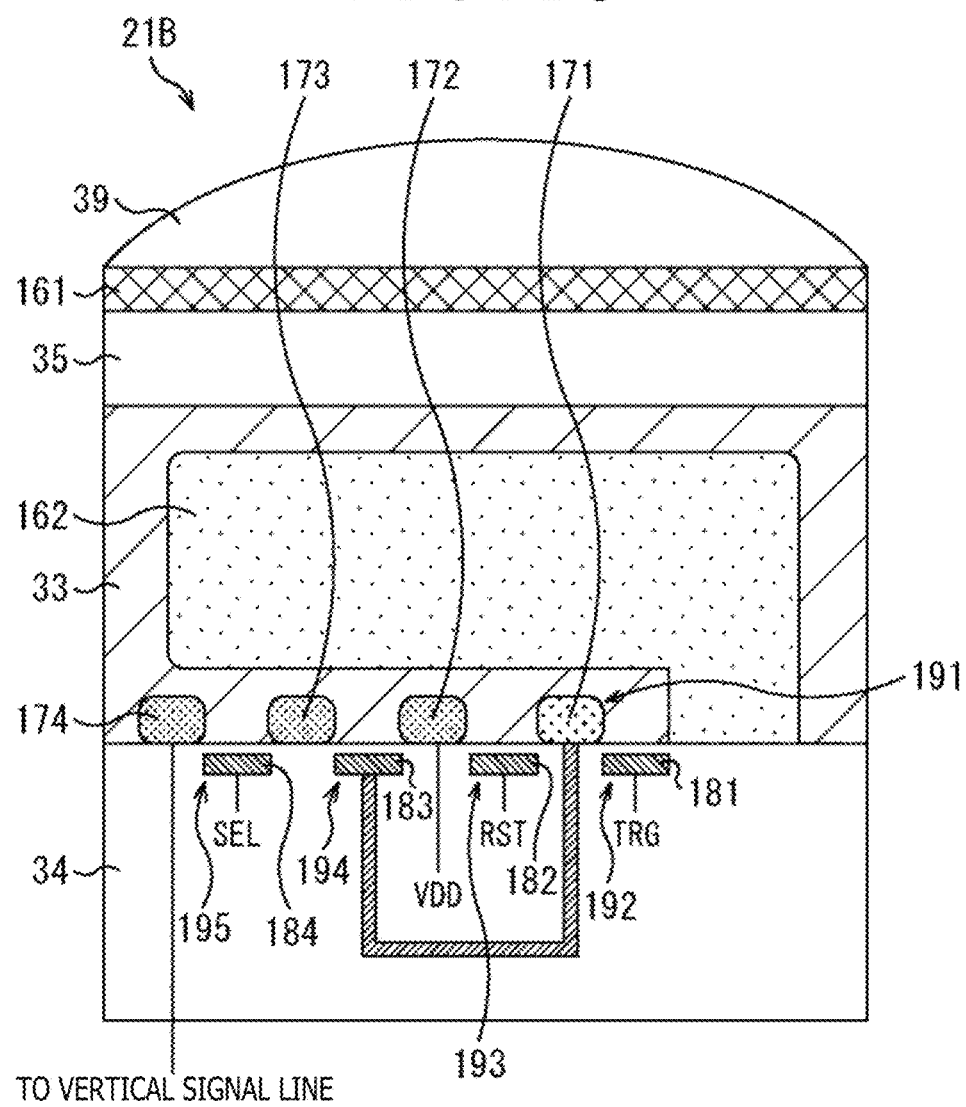
FIG. 13 is a diagram depicting a third configuration example of the pixel.

Next, FIG. 13 is a diagram depicting a third configuration example of the pixel 21.

In a pixel 21B depicted in FIG. 13, the same reference signs are provided to the components in common with the pixel 21 of FIG. 2, and the detailed description is not repeated.

FIG. 2 described above depicts the pixel 21 of the longitudinal spectral structure in which the red PD 31, the blue PD 32, and the green photoelectric conversion film 37 are arranged in the longitudinal direction. In contrast, the pixel 21B of FIG. 13 includes a PD 162 that photoelectrically converts light of one color transmitted through a color filter 161.

More specifically, the pixel 21B is constituted by laminating the wiring layer 34 on the front side (surface facing downward in FIG. 13) of the semiconductor substrate 33 provided with the PD 162 and laminating the insulating film 35, the color filter 161, and the on-chip lens 39 on the back side (surface facing upward in FIG. 2) of the semiconductor substrate 33.

The color filter 161 transmits light in a predetermined wavelength region, for example, light of one of red, blue, and green, in the light condensed by the on-chip lens 39.

The PD 162 is a photoelectric conversion unit including a PN junction of an N-type diffusion layer and a P-type diffusion layer formed on the semiconductor substrate 33, and the PD 162 photoelectrically converts and accumulates light of the color transmitted through the color filter 161.

Furthermore, N-type diffusion layers 171 to 174 are formed on the front side of the semiconductor substrate 33, and gate electrodes 181 to 184 are formed on the front side of the semiconductor substrate 33 through an insulating film.

For example, the N-type diffusion layer 171 constitutes an FD unit 191 that accumulates the charge generated by the PD 162. The N-type diffusion layer 171 further constitutes, along with the gate electrode 181 arranged between the N-type diffusion layer 171 and part of the PD 162 extending to the front side of the semiconductor substrate 33, a transfer transistor 192 that transfers the charge generated by the PD 162 to the FD unit 191. More specifically, the transfer transistor 192 is driven according to a transfer signal TRG supplied from the vertical drive circuit 13 to transfer the charge accumulated in the PD 162 to the FD unit 191.

Furthermore, the N-type diffusion layers 171 and 172 constitute a reset transistor 193 along with the gate electrode 182 arranged between the N-type diffusion layers 171 and 172, and the N-type diffusion layers 172 and 173 constitute an amplifier transistor 194 along with the gate electrode 183 arranged between the N-type diffusion layers 172 and 173. As depicted in the figure, the gate electrode 183 of the amplifier transistor 194 is connected to the FD unit 191. The N-type diffusion layers 173 and 174 also constitute a selection transistor 195 along with the gate electrode 184 arranged between the N-type diffusion layers 173 and 174.

In the pixel 21B configured in this way, the impurity concentration of the N-type diffusion layer 171 is also set to a concentration lower than the impurity concentration of the other N-type diffusion layers 172 to 174 similar to the pixel 21 of FIG. 2. Specifically, it is preferable to set the impurity concentration of the N-type diffusion layer 171 to 1e18 to 1e20/cm3 and set the impurity concentration of the N-type diffusion layers 172 to 174 to 1e20/cm3 or more.

This can also prevent defect sources, such as metal impurities contained in the semiconductor substrate 33, from gathering in the N-type diffusion layer 171 constituting the FD unit 191 in the pixel 21B and can prevent degradation of imaging characteristics.

Note that although the present technology is applied to the imaging device 11, such as a CMOS image sensor, in the example described in the embodiment described above, the present technology can be applied to semiconductor devices other than the imaging device 11. More specifically, the present technology can be applied to a semiconductor device including an FD unit that accumulates charge and a diffusion layer serving as a source or a drain of a transistor, and the impurity concentration of the FD unit can be set to a relatively low concentration to prevent the defect sources from gathering in the FD unit.

<Configuration Example of Electronic Device>

Note that the imaging device 11 including the pixels 21 according to each embodiment as described above can be applied to various electronic devices, such as a digital still camera, a digital video camera, other imaging systems, a mobile phone with an imaging function, and other devices with imaging functions.

Figure 14:
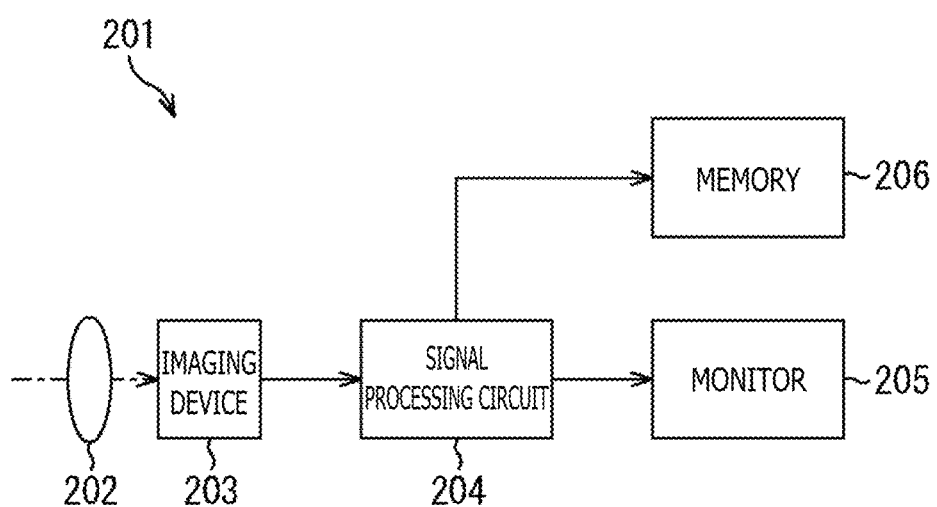
FIG. 14 is a diagram depicting a usage example of using an image sensor.

FIG. 14 is a block diagram depicting a configuration example of an imaging apparatus mounted on an electronic device.

As depicted in FIG. 14, an imaging apparatus 201 includes an optical system 202, an imaging device 203, a signal processing circuit 204, a monitor 205, and a memory 206 and is capable of taking still images and moving images.

The optical system 202 includes one or a plurality of lenses and guides image light (incident light) from a subject to the imaging device 203 to form an image on a light receiving surface (sensor unit) of the imaging device 203.

The imaging device 11 including the pixels 21 according to each embodiment described above is applied as the imaging device 203. Electrons are accumulated in the imaging device 203 for a certain period according to the image formed on the light receiving surface through the optical system 202. Then, a signal according to the electrons accumulated in the imaging device 203 is supplied to the signal processing circuit 204.

The signal processing circuit 204 applies various types of signal processing to the pixel signal output from the imaging device 203. The image (image data) obtained by the execution of the signal processing by the signal processing circuit 204 is supplied and displayed on the monitor 205 or supplied and stored (recorded) in the memory 206.

In the imaging apparatus 201 configured in this way, the imaging device 11 including the pixels 21 according to each embodiment described above can be applied to take an image with a better quality, for example.

<Usage Examples of Image Sensor>

Figure 15:
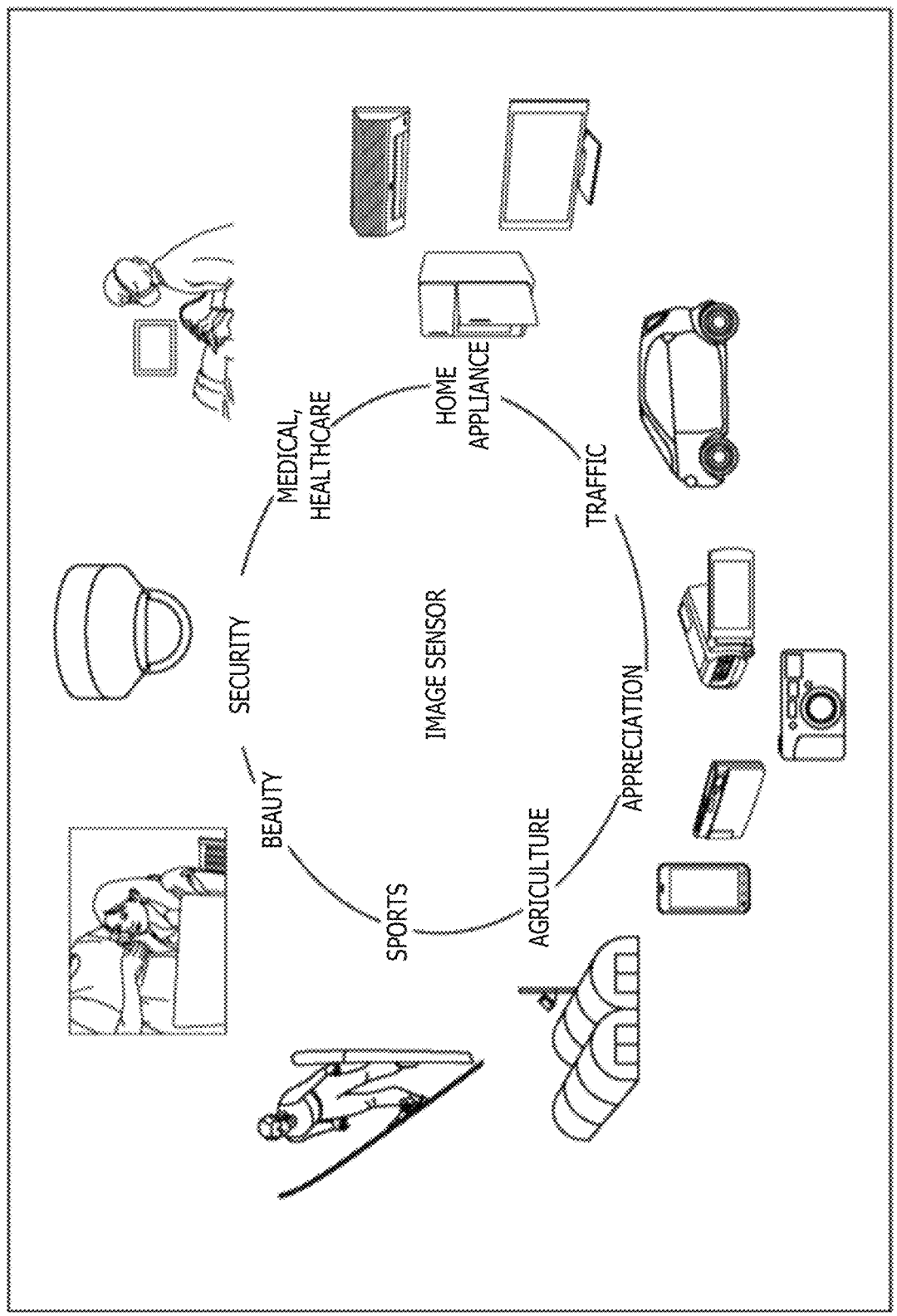
FIG. 15 is a block diagram depicting a configuration example of an embodiment of an electronic device applying the present technology.

FIG. 15 is a diagram depicting usage examples of using the image sensor (imaging device 11) described above.

The image sensor escribed above can be used, for example, in various cases of sensing light, such as visible light, infrared light, ultraviolet light, and X rays, as follows.

An apparatus that takes images for appreciation, such as a digital camera and a mobile device with a camera function An apparatus used for traffic, such as an on-board sensor that takes images of the front, back, surroundings, or inside of a car, a monitoring camera that monitors traveling vehicles or roads, and a distance measurement sensor that measures the distance between vehicles and the like, for safe drive like automatic stop or for recognizing the state of the driver An apparatus used as a home appliance, such as a TV, a refrigerator, and an air conditioner, that takes an image of a gesture of the user to perform device operation according to the gesture An apparatus used for medical care or healthcare, such as an endoscope and an apparatus that takes images of blood vessels by receiving infrared light An apparatus used for security, such as a monitoring camera for crime prevention and a camera for personal authentication An apparatus used for beauty, such as a skin measurement device that takes images of the skin and a microscope that takes images of the scalp An apparatus used for sports, such as an action camera and a wearable camera for sports and the like An apparatus used for agriculture, such as a camera that monitors the state of the farm or produce Note that the present technology can also have the following configurations.

(1)
An imaging device including:
a photoelectric conversion unit that receives and photoelectrically converts light;
a floating diffusion layer that accumulates charge generated by the photoelectric conversion unit; and
a diffusion layer that serves as a source or a drain of a transistor, in which
the floating diffusion layer is formed to have an impurity concentration lower than an impurity concentration of the diffusion layer.

(2)
The imaging device according to (1), in which
both a first photoelectric conversion unit that is able to accumulate the charge generated by the photoelectric conversion and a second photoelectric conversion unit from which the charge generated by the photoelectric conversion is sequentially taken out and accumulated in the floating diffusion layer are provided as the photoelectric conversion unit in one pixel, and
the first photoelectric conversion unit and the second photoelectric conversion unit are arranged in a line in a longitudinal direction along a direction of illumination of light.

(3)
The imaging device according to (2), in which
the impurity concentration of the floating diffusion layer that accumulates the charge generated by the second photoelectric conversion unit is set to a concentration lower than the impurity concentration of the diffusion layer.

(4)
The imaging device according to (2) or (3), in which
a first floating diffusion layer to which the charge generated by the first photoelectric conversion unit is transferred and a second floating diffusion layer that accumulates the charge generated by the second photoelectric conversion unit are each provided as the floating diffusion layer, and
an impurity concentration of the second floating diffusion layer is set to a concentration lower than an impurity concentration of the first floating diffusion layer.

(5)
The imaging device according to any one of (2) to (4), further including:
a contact electrode connected to the floating diffusion layer to take out the charge from the second photoelectric conversion unit, in which
an insulator is arranged between the contact electrode and a semiconductor substrate formed with the floating diffusion layer.

(6)
The imaging device according to any one of (1) to (5), in which
a sensor chip formed with the photoelectric conversion unit and a logic chip that executes predetermined arithmetic processing are laminated, and
the floating diffusion layer is formed to have an impurity concentration lower than an impurity concentration of the diffusion layer serving as a source or a drain of a transistor formed on the logic chip.

(7)

A manufacturing method of an imaging device including a photoelectric conversion unit that receives and photoelectrically converts light, a floating diffusion layer that accumulates charge generated by the photoelectric conversion unit, and a diffusion layer that serves as a source or a drain of a transistor, the manufacturing method separately including:
- a step of forming the floating diffusion layer; and
- a step of forming the diffusion layer, in which
- the floating diffusion layer is formed to have an impurity concentration lower than an impurity concentration of the diffusion layer.

(8)

A semiconductor device including:
- a floating diffusion layer that accumulates charge; and
- a diffusion layer that serves as a source or a drain of a transistor, in which
- the floating diffusion layer is formed to have an impurity concentration lower than an impurity concentration of the diffusion layer.

(9)

An electronic device including:
- an imaging device that includes
  - a photoelectric conversion unit that receives and photoelectrically converts light,
  - a floating diffusion layer that accumulates charge generated by the photoelectric conversion unit, and
  - a diffusion layer that serves as a source or a drain of a transistor;
- the floating diffusion layer being formed to have an impurity concentration lower than an impurity concentration of the diffusion layer.

Note that the present embodiments are not limited to the embodiments described above, and various changes can be made without departing from the scope of the present disclosure.

REFERENCE SIGNS LIST

11 Imaging device, 12 Pixel area, 13 Vertical drive circuit, 14 Column signal processing circuit, 15 Horizontal drive circuit, 16 Output circuit, 17 Control circuit, 21 Pixel, 22 Horizontal signal line, 23 Vertical signal line, 24 Data output signal line, 31 Red PD, 32 Blue PD, 33 Semiconductor substrate, 34 Wiring layer, 35 Insulating film, 36 Lower electrode, 37 Green photoelectric conversion film, 38 Upper electrode, 39 On-chip lens, 41 Contact electrode, 42 Insulating film, 51 to 59 N-type diffusion layer, 61 to 68 Gate electrode, 71 Contact electrode, 72 Wire, 73 and 74 Contact electrode, 75 Wire, 76 Contact electrode, 81 FD unit, 82 Reset transistor, 83 Amplifier transistor, 84 Selection transistor, 85 FD unit, 86 and 87 Transfer transistor, 88 Amplifier transistor, 89 Selection transistor, 90 Reset transistor, 101 Resist, 102 Opening, 103 Resist, 104 Opening, 105 Resist, 106 Opening, 111 Sensor chip, 112 Logic chip, 113 Semiconductor substrate, 114 Wiring layer, 121 to 129 N-type diffusion layer, 131 to 135 Gate electrode, 141 to 145 Transistor, 151 and 152 Electrode pad, 161 Color filter, 162 PD, 171 to 174 N-type diffusion layer, 181 to 184 Gate electrode, 191 FD unit, 192 Transfer transistor, 193 Reset transistor, 194 Amplifier transistor, 195 Selection transistor

The invention claimed is:

1. An imaging device, comprising:
   a photoelectric conversion unit that receives and photoelectrically converts light, wherein the photoelectric conversion unit includes a first photoelectric conversion unit and a second photoelectric conversion unit;
   a floating diffusion layer that accumulates charge generated by the second photoelectric conversion unit; and
   a diffusion layer that serves as one of a source or a drain of a transistor, wherein
   a gate electrode of the transistor is between the diffusion layer and a portion of the first photoelectric conversion unit, and
   an impurity concentration of the floating diffusion layer is lower than an impurity concentration of the diffusion layer.

2. The imaging device according to claim 1, wherein
   the first photoelectric conversion unit that is configured to accumulate the charge generated by the photoelectric conversion and the second photoelectric conversion unit from which the charge generated by the photoelectric conversion is sequentially taken out and accumulated in the floating diffusion layer constitute one pixel, and
   the first photoelectric conversion unit and the second photoelectric conversion unit are arranged in a line in a longitudinal direction along a direction of illumination of the light.

3. The imaging device according to claim 2, wherein
   the impurity concentration of the floating diffusion layer that accumulates the charge generated by the second photoelectric conversion unit is lower than the impurity concentration of the diffusion layer.

4. The imaging device according to claim 2, wherein
   the first photoelectric conversion unit is configured to transfer the charge to a first floating diffusion layer,
   the charge generated by the second photoelectric conversion unit is accumulated by a second floating diffusion layer,
   the first floating diffusion layer and the second floating diffusion layer constitute the floating diffusion layer, and
   an impurity concentration of the second floating diffusion layer is lower than an impurity concentration of the first floating diffusion layer.

5. The imaging device according to claim 2, further comprising:
   a contact electrode connected to the floating diffusion layer to take out the charge from the second photoelectric conversion unit; and
   an insulator between the contact electrode and a semiconductor substrate formed with the floating diffusion layer.

6. The imaging device according to claim 1, further comprising a sensor chip that includes the photoelectric conversion unit and a logic chip that executes a determined arithmetic process, wherein
   the sensor chip and the logic chip are laminated, and
   the diffusion layer serves as one of the source or the drain of the transistor on the logic chip.

7. A method of manufacturing an imaging device, comprising:
   forming a floating diffusion layer, wherein
   the imaging device comprises a first photoelectric conversion unit and a second photoelectric conversion unit, and
   the floating diffusion layer accumulates charge generated by the second photoelectric conversion unit of the imaging device; and forming a diffusion layer, wherein
the diffusion layer serves as one a source or a drain of a transistor,
a gate electrode of the transistor is between the diffusion layer and a portion of the first photoelectric conversion unit, and
an impurity concentration of the floating diffusion layer is lower than an impurity concentration of the diffusion layer.

8. A semiconductor device, comprising:
a floating diffusion layer that accumulates charge; and
a diffusion layer that serves as one of a source or a drain of a transistor, wherein
a gate electrode of the transistor is between the diffusion layer and a portion of a photoelectric conversion unit, and
an impurity concentration of the floating diffusion layer is lower than an impurity concentration of the diffusion layer.

9. An electronic device, comprising:
an imaging device that includes:
a photoelectric conversion unit that receives and photoelectrically converts light, wherein the photoelectric conversion unit includes a first photoelectric conversion unit and a second photoelectric conversion unit;
a floating diffusion layer that accumulates charge generated by the second photoelectric conversion unit; and
a diffusion layer that serves as one of a source or a drain of a transistor, wherein
a gate electrode of the transistor is between the diffusion layer and a portion of the first photoelectric conversion unit, and
an impurity concentration of the floating diffusion layer is lower than an impurity concentration of the diffusion layer.

10. The imaging device according to claim 1, further comprising a substrate, wherein
the first photoelectric conversion unit is one of a red photodiode or a blue photodiode in the substrate,
the second photoelectric conversion unit is a green photoelectric conversion film on the substrate, and
the diffusion layer is between the first photoelectric conversion unit and a third photoelectric conversion unit.

* * * * *